United States Patent
Thoss et al.

(10) Patent No.: US 9,194,688 B2
(45) Date of Patent: Nov. 24, 2015

(54) INDUCTIVE PROXIMITY SENSOR

(71) Applicant: SICK AG, Waldkirch/Breisgau (DE)

(72) Inventors: Sascha Thoss, Freiburg (DE); Olaf Machul, Merzhausen (DE); Josef Baak, Waldkirch (DE)

(73) Assignee: SICK AG, Waldkirch/Breisgau (DE)

( * ) Notice: Subject to any disclaimer, the term of this patent is extended or adjusted under 35 U.S.C. 154(b) by 369 days.

(21) Appl. No.: 13/861,869

(22) Filed: Apr. 12, 2013

(65) Prior Publication Data

US 2013/0271158 A1    Oct. 17, 2013

(30) Foreign Application Priority Data

Apr. 13, 2012    (EP) .................................... 12164136

(51) Int. Cl.
  *G01B 7/14*    (2006.01)
  *H03K 17/95*    (2006.01)
(52) U.S. Cl.
  CPC .............. *G01B 7/14* (2013.01); *H03K 17/9512* (2013.01); *H03K 17/9547* (2013.01)
(58) Field of Classification Search
  CPC .. G01R 27/2611; G01B 7/14; H03K 17/9512; H03K 17/9547
  USPC ......................................... 324/654, 649, 600
  See application file for complete search history.

(56) References Cited

U.S. PATENT DOCUMENTS

| | | | |
|---|---|---|---|
| 4,837,511 A * | 6/1989 | Whittington et al. | 324/236 |
| 5,418,456 A * | 5/1995 | Cook et al. | 324/207.23 |
| 6,091,765 A * | 7/2000 | Pietzold et al. | 375/219 |
| 6,196,371 B1 * | 3/2001 | Martin et al. | 194/317 |
| 6,484,974 B1 * | 11/2002 | Franke et al. | 246/476 |
| 6,629,889 B2 * | 10/2003 | Mothwurf | 463/25 |
| 7,847,539 B2 * | 12/2010 | Machul et al. | 324/207.15 |
| 8,401,600 B1 * | 3/2013 | Filippov et al. | 505/190 |

(Continued)

FOREIGN PATENT DOCUMENTS

| | | |
|---|---|---|
| DE | 19947380 A1 | 4/2001 |
| DE | 102007007551 A1 | 8/2008 |

(Continued)

OTHER PUBLICATIONS

European Search Report dated Jul. 5, 2012, for corresponding EP Application 12 164 136.9, with English Translation.

*Primary Examiner* — Hoai-An D Nguyen
(74) *Attorney, Agent, or Firm* — Nath Goldberg & Meyer; Jerald L. Meyer; Rury L. Grisham

(57) ABSTRACT

The invention relates to an inductive proximity sensor for determining the presence and/or the distance of an electrically conductive object which is designed to evaluate an oscillation in the form of an analog signal whose amplitude depends on the presence or absence and/or on the distance of an electrically conductive object. In accordance with the invention, the inductive proximity sensor includes at least one A/D converter which converts this analog signal into a digital input signal and includes at least one mixer which multiplies the digital input signal by a digital reference signal to form a digital output signal, wherein the digital reference signal is identical to the digital input signal or only differs from the digital input signal by a constant factor. The invention further relates to a method for determining the presence and/or the distance of an electrically conductive object with the aid of a proximity sensor.

22 Claims, 1 Drawing Sheet

(56) References Cited

U.S. PATENT DOCUMENTS

| | | |
|---|---|---|
| 9,014,307 B2 * | 4/2015 | Seely .......................... 375/340 |
| 2005/0231360 A1 | 10/2005 | Fujimori et al. |
| 2008/0197839 A1 | 8/2008 | Machul et al. |

FOREIGN PATENT DOCUMENTS

| | | |
|---|---|---|
| DE | 102009028619 A1 | 3/2010 |
| EP | 0070796 B1 | 1/1983 |

* cited by examiner

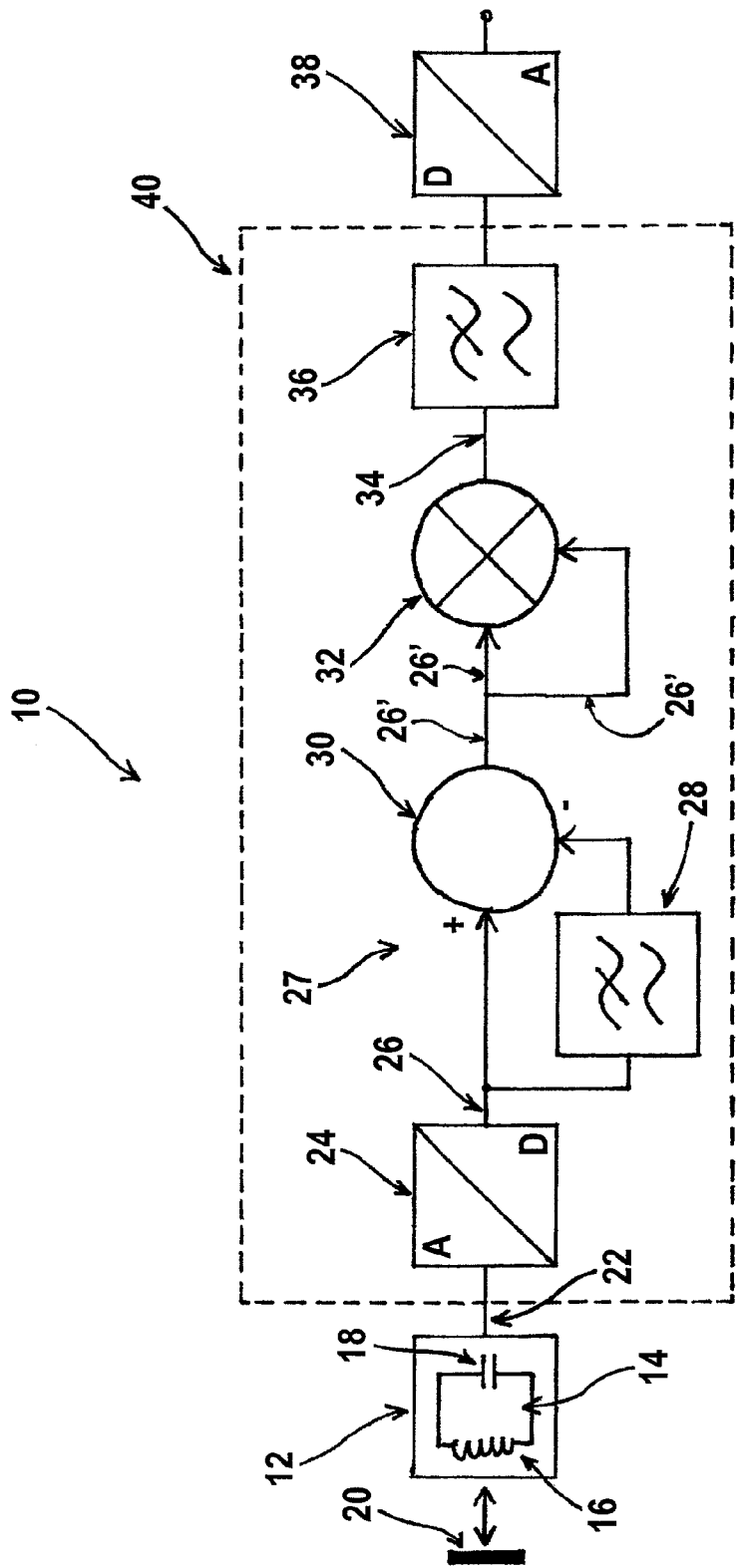

INDUCTIVE PROXIMITY SENSOR

The invention relates to an inductive proximity sensor which is designed to evaluate an oscillation in the form of an analog signal whose amplitude depends on the presence or absence and/or on the distance of an electrically conductive object as well as to a method of determining the presence and/or the distance of an electrically conductive object.

Inductive proximity sensors detect electrically conductive metals on the basis of the eddy current principle. An alternating magnetic field which is radiated into space in a directed manner is built up e.g. by means of an electrical resonant circuit from a coil and a capacitor (LC resonant circuit). If an electrically conductive object (also called a "target" in the following) moves into the range of the alternating field, eddy currents are induced in the target by the alternating field which in turn give rise to a magnetic field which is oppositely directed to the exciting magnetic field. The generation of the eddy currents removes energy from the exciting magnetic field and thus influences the impedance of the coil or damps the LC resonant circuit. An output signal output by the LC resonant circuit maps the oscillation of the resonant circuit as a current development or voltage development. The output signal in this respect typically has frequencies in the proximity of a resonant frequency of the resonant circuit at which the resonant circuit can be excited particularly well to make oscillations. The oscillation intensity within a frequency band of the output signal decreases in the frequency range about the resonant frequency.

The oscillation amplitude of the output signal represents a measure for the damping of the resonant circuit and thus allows the detection and the determination of the distance of the target from that element at which the analog signal with the oscillation is subject to the influence of the target. This element can be a sensor element of the proximity sensor, for example. The target can, for example, be a switch cam which can trigger a switching signal via the proximity sensor.

It is necessary to determine the amplitude information precisely from the output signal of the LC resonant circuit for the reliable determination of the presence and/or of the distance of the target. This usually takes place with the aid of analog circuits which e.g. include analog inverters. In addition, frequently only a threshold value detection is provided in corresponding apparatus or methods, but not a continuous distance measurement. In this case, the analog circuits have, for example, a peak detector or a comparator. A detection method customary and used often in the prior art comprises, for example, the analog rectifying of the output signal of the LC resonant circuit with a subsequent filtering and concluding comparison of the filtered signal with a switching threshold via a comparator.

Temperature variations which influence the impedance of the LC resonant circuit can result in falsifications of the output signal. Methods of compensating this effect have therefore been proposed. Such a method is described, for example, in the European patent specification EP 0 070 796 B1. The analog compensation of the temperature influence disclosed there requires a relatively complex and/or expensive circuit.

The influence of the target on the output signal of the resonant circuit is very highly dependent on the distance since the magnetic field in the near zone decreases to the third power in space. Typical switching distances between a target and the sensor therefore only amount to a few millimeters. The quality of the distance detection and the possibility associated with this of realizing comparatively large switching distances, depend inter alia on the measurement accuracy of the starting signal of the resonant circuit. It is therefore advantageous to convert the analog output signal into a digital signal at the earliest possible time of its processing to very largely preclude external electromagnetic interference influences. The digitizing of the analog output signal of the resonant circuit of an inductive proximity sensor is described, for example, in the laying-open specification DE 10 2007 007 551 A1. The circuit disclosed therein converts the analog input signal into a digital pulse-occurrence modulated data stream which directly corresponds to the oscillation amplitude of the resonant circuit. The type of digitizing disclosed there is based on a complex circuit with feedback.

It is the underlying object of the invention to allow an inductive proximity sensor with a safe and robust operation in as simple and as inexpensive a manner as possible.

This object is satisfied by an inductivity proximity sensor having the features of claim 1 and by a method of determining the presence and/or distance of an electrically conductive object having the features of claim 11. Preferred aspects are the subject of dependent claims.

The inductive proximity sensor in accordance with the invention is characterized in that it includes at least one A/D converter which converts the analog output signal into a digital input signal for a mixer and at least one mixer. The mixer is in this respect provided to multiply the digital input signal by a digital reference signal to form a digital output signal, with the digital reference signal being identical to the digital input signal or only differing from the digital input signal by a constant factor.

Since the analog signal to be evaluated by the inductive proximity sensor is already converted into a digital input signal at an early processing stage, the inductive proximity sensor in accordance with the invention is particularly robust with respect to external electromagnetic interference influences. After the digitizing of the signal, it still includes an oscillation from whose amplitude the distance information can be acquired. Since the signal is, however, now present in digital form, the further processing of the signal provided for this purpose is possible digitally in a simple manner and consequently does not have to be realized by complex analog circuits. The digital mixer input signal in particular includes the complete distance information as a continuous signal (in the form of the digital sampling values). Not only the presence of the target can therefore be detected by a comparison with a threshold value, but also a continuous measure for the distance of the target can be output. If only a binary presence detection is intended, the switching distance can be fixed or modified in a simple manner by storing the threshold value in digital form.

The implementation in accordance with the invention further provides that the digital input signal is multiplied by a digital reference signal by a mixer. The mixer can in this respect represent an independent digital processing unit or can also be designed as part of a program routine, for example with a microprocessor. The digital reference signal differs in accordance with the invention from the digital input signal by which it is multiplied only by a constant factor which can amount to one so that in this case the digital input signal and the digital reference signal are identical. The multiplication of the digital input signal by the digital reference signal in this respect corresponds to a squaring of the digital input signal and, optionally, a scaling by a constant factor. This squaring represents a substantial step toward acquiring the amplitude information from the digital input signal.

If the signal to be evaluated by the inductive proximity sensor is considered as a harmonious oscillation or superimposition of a plurality of harmonious oscillations, the following formula for the product of two sine functions applies to the multiplication in the mixer:

$$U_1 \cdot \sin(2\cdot\pi\cdot f_1 \cdot t) \cdot U_2 \cdot \sin(2\cdot\pi f_2 \cdot t) = \tfrac{1}{2} \cdot U_1 \cdot U_2 \cdot (\cos(2\cdot\pi\cdot(f_1-f_2)\cdot t) - \cos(2\cdot\pi\cdot(f_1+f_2)\cdot t)),$$

where $U_1$ and $U_2$ are the amplitudes and $f_1$ and $f_2$ are the frequencies of the oscillation and t designates the time. If the two multiplied oscillations do not differ in their frequency (i.e. $f_1=f_2=f$) and only by a constant factor A in their amplitude, $$U \cdot \sin(2\cdot\pi f \cdot t) \cdot A \cdot U \cdot \sin(2\cdot\pi \cdot f \cdot t) = \tfrac{1}{2} \cdot A \cdot U^2 \cdot (1-\cos(2\cdot\pi\cdot 2f \cdot t))$$

results.

Consequently, the product of the oscillations has an oscillation portion with double the frequency 2f and a constant component. The amplitude $\tfrac{1}{2}\cdot A\cdot U^2$ of the multiplied oscillation in this respect has an effect both on the frequency-doubled oscillation and on the constant component so that the amplitude information can be extracted in a simple manner from the amount of the constant component. The fact that the amplitude is in this respect modified by squaring and multiplication by $\tfrac{1}{2}\cdot A$ does not have a disadvantage effect on the determination of the distance information since, on the one hand, a calculation back to the original amplitude U can easily be made and, on the other hand, the amplitude U of the oscillation anyway does not as a rule relate linearly to the target distance. It is therefore only important that the amplitude information can clearly be associated with a target distance, for example by calibration or theoretical calculation. This is not impaired either by the squaring or by any other multiplication.

The advantage of the squaring of the constant component of a signal with respect to a customary rectification of the signal by absolute value formation in particular results from the fact that in the absolute value formation with the usual rectification radio-frequency portions are produced by applying the amount function which can superimpose themselves on the actual signal so that information is lost or falsified. This effect is avoided by the squaring, which results in a higher accuracy of the inductive proximity sensor.

The inductive proximity sensor in accordance with the invention thus makes it possible in a simple manner, on the one hand, to ensure the robustness with respect to electromagnetic interference influences by digitizing the signal right at the start of the signal processing and, on the other hand, to make the amplitude information from the oscillation of the analog signal accessible by multiplication of the digital input signal substantially by itself. The digitizing moreover opens up a variety of further possibilities of digital signal processing such as a digital filtering and a digital linearizing of the signal for which otherwise specifically designed analog circuits would be required.

The digital output signal generated by the multiplication in the mixer having the distance information can be output directly in digital form by the inductive proximity sensor. A D/A converter can, however, also be provided which first converts the digital output signal into an analog output signal which is ultimately output. The oscillation can be produced by an external transmitter or by a transmitter integrated into the proximity sensor and can be detected by a receiver in the inductivity proximity sensor. A damping of this oscillation by an electrically conductive object to be detected, in particular when eddy currents are inducted therein by the alternating field of the oscillation, can then be detected and be evaluated in accordance with the invention as described.

The inductive proximity sensor preferably, however, includes a sensor element having a resonant circuit which can in particular be an LC resonant circuit. The analog signal applied to the inductive proximity sensor then corresponds to the oscillation of this resonant circuit. A resonant circuit represents a simple possibility of producing an analog oscillation signal which is moreover directly dependent on the damping by an electrically conductive object, with the damping being produced by the induction of eddy currents in the object by the alternating field built up by the resonant circuit. The amplitude information of the resonant circuit, which is a measure for the damping of the oscillation, is then evaluated in accordance with the invention as described. The integration of the sensor element with the resonant circuit in the inductive proximity sensor in particular allows a compact construction of the inductive proximity sensor.

In accordance with preferred embodiments of the inductive proximity sensor in accordance with the invention, it includes a first low pass filter which is arranged after the mixer in the signal direction. This low pass filter makes it possible to liberate the digital output signal from higher frequency portions so that in particular the constant component is output in which, as shown above, the amplitude information and thus the distance information are included. The first low pass filter preferably has a limit frequency which is less than twice the frequency of the oscillation. The low pass filter therefore allows frequencies beneath this limit frequency to pass substantially unchanged and filters frequencies above this limit frequency from the signal. Since the limit frequency is smaller than the twice the frequency of the oscillation, in particular those frequency portions are filtered which arose on the multiplication in the mixer and particularly have double the frequency in comparison with the signals entering into the mixer.

In a particularly advantageous embodiment, the first low pass filter substantially allows only the constant component of the signal guided thorough the filter to pass. A limit frequency of the low pass filter accordingly selected as particularly low thus does not only filter the portions having the frequency doubled by the mixing, but possibly in additional existing other oscillation portions, caused e.g. by interference influences, so that the distance information contained in the constant component of the digital output signal can be determined with even more precision.

In a further preferred embodiment of the inductive proximity sensor in accordance with the invention, it includes a filter device which is arranged in front of the mixer in the signal direction and by which a constant component of a signal guided through the filter device is separated. The separation of the constant component can in particular take place digitally, whereby a further analog component can be dispensed with. Ideally, neither the analog signal nor the digital input signal converted from it in front of the mixer should admittedly have a constant component at all since the oscillation, in particular when it is generated by a resonant circuit, should substantially have purely sine oscillations or superimpositions of sine oscillations. However, it may occur in the components used in practice, in particular in the A/D converters prone to them, that the signal has a certain constant component (offset) which may also be time variable (offset drift). The named embodiment with a filter device has the advantage that such an offset or such an offset drift is already eliminated before the first step for determining the amplitude signal in the mixer. The function of the multiplication in the mixer, namely the generation of a constant component which has the distance information is ensured in this manner since otherwise the distance information would be falsified by an offset.

It is in particular preferred if the filter device includes a second low pass filter which substantially only allows a constant component of the signal to pass and a subtractor, with the subtractor and the second low pass filter being arranged such that the subtractor outputs the difference between the unfiltered signal and the constant component of this signal output by the low pass filter. The second low pass filter and the subtractor cooperate in this manner as a unit so that ultimately a constant component of a signal guided through this unit is separated. This corresponds to the function of a high pass filter which could alternatively be used as the named filter device.

The use of the term "second" low pass filter serves for distinguishing with respect to the "first" low pass filter described further above and should not be understood such that an implementation would not also be possible in which a "second" low pass filter is admittedly provided, but not a "first" low pass filter.

So that no information is lost on the conversion of the analog signal into the digital input signal of the mixer, in accordance with the Nyquist-Shannon theory, the frequency at which the analog signal is sampled in the A/D converter is at least twice as large as the portion with the highest frequency in the sampled signal., If this is not the case, portions with frequencies which lie above half the sampling frequency are admittedly changed into the digital signal with the correct amplitude, but with too low a frequency, which is also called aliasing. In this respect, it is possible that portions of the analog signal which correspond to different frequencies are mapped on the same frequency in the digital signal and are therefore superimposed so that information is lost. If, however, the analog signal to be converted only has frequencies in a defined range (frequency band), it is possible, despite a sampling with frequencies which are too low according to the Nyquist-Shannon theory, that the frequencies of the analog signal are admittedly mapped to different frequencies in the digital signal, but no superimposition of originally different frequencies takes place in the digital signal. No information is thus lost despite the frequency change. The fact that the digitizing of an analog signal still takes place free of information loss despite the sampling frequency being too small, only applies, however, to specific suitable scanning frequencies. The direct choice of such a suitable sampling frequency, which is actually too low according to the Nyquist-Shannon theory, corresponds to the principle of the so-called band pass undersampling.

Since the oscillation to be evaluated by the inductive proximity sensor, in particular when it was generated by a resonant circuit, is a signal which substantially only comprises frequency portions in a defined frequency band about a (main) frequency of the oscillation (e.g. a resonant frequency of the resonant circuit), the named principle of band pass undersampling can be applied to this signal.

In a possible embodiment of the inductive proximity sensor in accordance with the invention, the A/D converter has a sampling frequency which is larger than twice the frequency of the oscillation. In this case, the Nyquist-Shannon theory is substantially satisfied. The use of an A/D converter with such a sampling frequency for sampling an analog signal does not require any further taking into account of possible frequency shifts.

In a particularly preferred embodiment of the inductive proximity sensor in accordance with the invention, the sampling frequency of the A/D converter in contrast corresponds to a frequency suitable in accordance with the principle of band pass undersampling. The sampling frequency can precisely then be considered as suitable if the whole frequency band of the analog signal after a sampling at this sampling frequency is transferred to frequencies in the digital input signal such that no two different frequencies in the analog signal are transferred to the same frequency in the digital signal. The advantage of the band pass undersampling comprises also being able to used commercial and inexpensive A/D converters with oscillations with a radio-frequency frequency band, for example about a (main) frequency of the oscillation of 540 kHz, with typical sampling rates of, for example, 400 kHz and not having to use A/D converters with a sampling frequency in accordance with the Nyquist-Shannon theory, that is of approximately 1.1 MHz or more. Such A/D converters with comparatively high sampling frequencies would be considerably more expensive and have a considerably higher power consumption than conventional A/D converters with lower sampling frequencies. Since the further processing units such as the mixer, for instance, which can, for example, be implemented by a microprocessor, have to work at a correspondingly higher pulsing, practical upper limits are already thereby set for the sampling frequency for a real-time processing of the digital signal. In contrast, the frequency of the oscillation of the inductive proximity sensor can also be very high by using the band pass undersampling. A low sampling frequency in particular makes possible a small pulsing of the further digital signal processing which can therefore also be implemented as software.

In a further preferred embodiment of the inductive proximity sensor in accordance with the invention, the A/D converter has a sampling frequency which can be dynamically adapted to a change in the frequency of the oscillation and/or to a change in the bandwidth of the analog signal. Such an adaptation is in particular of advantage when the sampling frequency lies beneath twice the frequency of the oscillation in accordance with the principle of bandpass undersampling. Since the sampling frequency cannot be as desired in this case, but, as explained above, has to be selected suitably, it can be necessary, if the frequency band of the analog signal changes, to carry out a suitable adaptation of the sampling frequency. The change in the frequency band of the analog signal can comprise, for example, a change of the bandwidth and/or of the frequency of the oscillation.

The object is furthermore satisfied by a method having the features of claim 11. The advantages of the method in accordance with the invention and particularly preferred aspects result in an analog manner from the above explanations of corresponding embodiments of the apparatus in accordance with the invention and is advantages.

A particularly advantageous embodiment of the method in accordance with the invention includes the modifying of the digital input signal and/or of the digital output signal for compensating a temperature influence on the analog signal. In this respect, the temperature influence on the analog signal can e.g. be a consequence of temperature influence on a resonant circuit of the inductive proximity sensor or on individual components of the proximity sensor. Interfering influences of the temperature on measurements with inductive proximity sensors are known and substantially understood. A temperature-dependent compensation of these influences can therefore be carried out. It is particularly advantageous if this compensation is applied to the digital signal because as part of the digital signal processing by means of a microprocessor, for example, a variety of manipulations of the signal are possible in a particularly simple manner. The digital temperature compensation can in this respect, for example, take place by interpolation or by using a look-up table.

In accordance with a particularly preferred embodiment of the inductive proximity sensor in accordance with the invention, it includes a microprocessor which is suitable to carry out method steps in accordance with the method in accordance with the invention or in accordance with particularly preferred embodiments of this method. The implementation of the method steps in a microprocessor represents a particularly flexible and simple embodiment because a microprocessor as an individual unit can carry out a plurality of different method steps.

It is particularly preferred if the at least one A/D converter of the inductive proximity sensor is integrated in the microprocessor. In this case, the inductive proximity sensor can be produced as a single module or, if the inductive proximity sensor includes a sensor element, only from two modules, namely the sensor element and the microprocessor.

A further advantageous embodiment of the inductive proximity sensor in accordance with the invention provides that the inductive proximity sensor includes an application-specific integrated circuit (ASIC) which is suitable to carry out method steps in accordance with the method in accordance with the invention or in accordance with particularly preferred embodiments of the method in accordance with the invention. The use of a special ASIC ensures a high degree of integration of the inductive proximity sensor. The ASIC can be designed optimized for the desired method steps so that they can be carried out particularly efficiently, for example fast and/or power-saving. With high volumes, the use of application-specific integrated circuits can moreover be less expensive than, for example, the use of a microprocessor which can generally be used.

The invention will be explained in detail in the following with reference to an exemplary embodiment and to the enclosed schematic Figure. There is shown FIG. 1 a block diagram of an embodiment of the inductive proximity sensor in accordance with the invention.

An inductive proximity sensor 10 in accordance with the invention is shown as a block diagram 10 in FIG. 1. The proximity sensor 10 includes a sensor element 12 having an LC resonant circuit 14, wherein the LC resonant circuit 14 is made up of a coil 16 and a capacitor 18 and can in particular be excited to make oscillations in a frequency range around a resonant frequency. A current/voltage supply provided for operation of the resonant circuit 14 and of the total inductive proximity sensor 10 is not shown. The oscillation of the LC resonant circuit 14 is output as an analog signal 22 by the sensor element 12. The oscillation of the LC resonant circuit 14 is damped in dependence on the distance of an electrically conductive object (target) 20 from the sensor element 12, which in particular has an effect on the amplitude of the analog signal 22.

The analog signal 22 of the LC resonant circuit 14 is supplied to an A/D converter 24 as directly as possible to digitize the analog signal 22 and thus very largely to reduce the proneness for electromagnetic interference influences. The A/D converter 24 has a sampling frequency which is smaller than twice the resonant frequency of the LC resonant circuit 14. The frequencies of the analog signal 22 can therefore not be transferred unchanged into the digital input signal 26 in accordance with the Nyquist-Shannon theory, but are rather mapped on lower frequencies. The sampling frequency of the A/D converter 24 corresponds to a sampling frequency which is suitably adapted with respect to the resonant frequency of the LC resonant circuit 14 and to the bandwidth of the analog signal 22 and which allows in accordance with the principle of the band pass undersampling the frequency band of the analog signal 22 to be transferred clearly to a frequency band of the digital input signal 26 output by the A/D converter despite the small sampling frequency. The distance information included in the amplitude of the oscillations is thereby maintained and is not falsified.

The digital input signal 26 output by the A/D converter 24 subsequently passes through a filter device 27 which includes a second low pass filter 28 and a subtractor 30. In this respect, the digital input signal 26 is supplied to both the second low pass filter 28 and also, unfiltered, to the subtractor 30 as a minuend. The second low pass filter 28 can substantially only pass a constant component of the digital input signal 26 which is supplied to the subtractor 30 as a subtrahend. The constant component of the digital input signal 26 is thus subtracted from the digital input signal 26 in the subtractor 30 so that the filter device 27 outputs the digital input signal 26' free of a previously possibly present constant component (the digital input signal is designated in the following by reference numeral 26' after it has passed the filter device 27). Such a constant component could already have been present in the analog signal 22 as a consequence of an offset of the LC resonant circuit 14. An offset could, however, also be caused in the digital input signal 26 by the A/C converter 24. Slow changes of such an offset (offset drift) will also be reliably removed from the digital input signal 26 by the cooperation of the second low pass filter 28 and the subtractor 30 as a filter device 27.

The term "digital input signal" is used here for the signal digitized by the A/D converter 24 which is input to the mixer 32—optionally via intermediate stages such as the filter device 27—(therefore "input signal"). In the embodiment described, the digital input signal 26 is liberated of its constant component by the filter device 27 and is then input into the mixer 32 as a correspondingly modified digital input signal 26'.

The digital input signal 26' liberated of possible constant components is supplied to the two inputs of a mixer 32 in which a multiplication of the two input signals 26' takes place. In the embodiment shown, the two input signals 26' are identical; however, within the framework of the invention, they could also differ by a constant factor. The digital output signal 34 output by the mixer 32 corresponds to a squaring of the digital input signal 26' liberated from a constant component. Due to this squaring, the digital output signal 34 is composed, in accordance with the laws for the product of trigonometric functions, of two generally different portions: On the one hand, the digital output signal 34 has oscillation portions whose frequencies particularly correspond to a doubling of the frequencies of the digital input signal 26'; on the other hand, a new constant component arises in the digital output signal 34 by the squaring and the amount of said constant component corresponds to half the square of the oscillation amplitude of the digital input signal 26'. Since the information on the distance of the target 20 from the sensor element 12 was included in the oscillation amplitude of the analog signal 22, this information can now be determined directly from the amount of the constant component of the digital output signal 34.

In the present embodiment, the digital output signal 34 is for this purpose supplied to a first low pass filter 36 which substantially only allows the named constant component of the digital output signal 34 to pass, while the frequency-doubled portions are filtered. The digital signal output by the first low pass filter 36 then represents a direct continuous measure for the distance of the target 20 from the sensor element 12 of the inductive proximity sensor 10.

Since the distance information is present in digital form, it can be further offset in a simple manner. For example, a digital temperature compensation is provided by which the influence of the temperature on the distance measurement is compensated and which is not shown here. In addition, the digital output signal can easily be linearized in accordance with a calibration or theoretical calculations in the course of further digital signal processing, which is likewise not shown in FIG. 1, so that its value is directly proportional to the distance of the target 20 from the sensor element 12.

In the embodiment shown, the digital output signal 34 thus processed is finally converted in to an analog output signal and output by means of a D/A converter 38. The analog output signal in this respect has the amount of the processed digital output signal 34 and thus the distance information as a voltage value. It is alternatively possible that the distance information is output as a current of the analog output signal. In the embodiment of FIG. 1, the A/D converter 24, the filter device 27 with the second low pass filter 28 and the subtractor 30, the mixer 32 and the first low pass filter 36 are components of a microprocessor 40 in which the filtering processes, the subtraction and the multiplication are implemented as software and which includes the A/D converter 24 as an integrated module.

Reference Numeral List 10 inductive proximity sensor
12 sensor element
14 LC resonant circuit
16 coil
18 capacitor
20 electrically conductive object, target
22 analog signal
24 A/D converter
26, 26' digital input signal
27 filter device
28 second low pass filter
30 subtractor
32 mixer
34 digital output signal
36 first low pass filter
38 D/A converter
40 microprocessor

The invention claimed is:

1. An inductive proximity sensor (10) for determining at least one of a presence of an electrically conductive object and a distance of an electrically conductive object (20), wherein said sensor is designed to evaluate an oscillation in the form of an analog signal having an amplitude, with the amplitude depending on a member of the group consisting of the presence of an electrically conductive object, an absence of an electrically conductive object and the distance of an electrically conductive object (20),
the inductive proximity sensor (10) comprising at least one A/D converter (24); and at least one mixer (32), wherein the at least one A/D converter (24) converts said analog signal (22) into a digital input signal (26, 26'); wherein the at least one mixer (32) multiplies the digital input signal (26, 26') by a digital reference signal to form a digital output signal (34), wherein the digital reference signal is either identical to the digital input signal (26, 26') or only differs from the digital input signal (26, 26') by a constant factor.

2. The inductive proximity sensor in accordance with claim 1, further comprising a sensor element (12) having a resonant circuit (14), wherein the resonant circuit provides an analog signal (22) which depends on a damping of the resonant circuit (14) by the electrically conductive object.

3. The inductive proximity sensor in accordance with claim 2, wherein the resonant circuit comprises an LC resonant circuit having a resonant frequency.

4. The inductive proximity sensor in accordance with claim 1, further comprising a first low pass filter (36), said first low pass filter being arranged after the at least one mixer (32) in the signal direction.

5. The inductive proximity sensor in accordance with claim 4, wherein the first low pass filter (36) has a limit frequency which is smaller than twice the frequency of the oscillation.

6. The inductive proximity sensor in accordance with claim 4, wherein the first low pass filter (36) allows a constant component of a signal guided through the first low pass filter (36) to pass.

7. The inductive proximity sensor in accordance with claim 4, wherein the first low pass filter (36) substantially allows only a constant component of a signal guided through the first low pass filter (36) to pass.

8. The inductive proximity sensor in accordance with claim 1, further comprising a filter device (27), with said filter device being arranged in front of the at least one mixer (32) in the signal direction and said filter device being configured to separate a constant component of a signal guided through the filter device (27).

9. The inductive proximity sensor in accordance with claim 8, wherein the separation of the constant component takes place digitally by the filter device (27).

10. The inductive proximity sensor in accordance with claim 8, wherein the filter device (27) of the inductive proximity sensor (10) comprises a second low pass filter (28);
and a subtractor (30), said second low pass filter and said subtractor being arranged such that the subtractor (30) outputs the difference between an unfiltered signal and the constant portion of the unfiltered signal.

11. The inductive proximity sensor in accordance with claim 10, wherein the second low pass filter only allows a constant component of a signal guided through the low pass filter (28) to pass.

12. The inductive proximity sensor in accordance with claim 1, wherein the at least one A/D converter (24) has a sampling frequency which is either larger than twice the frequency of the oscillation or corresponds to a frequency suitable in accordance with the principle of band pass undersampling.

13. The inductive proximity sensor in accordance with claim 1, wherein the at least one A/D converter (24) has a sampling frequency which can be dynamically adapted to at least one of a change in the frequency of the oscillation and a change in a bandwidth of the analog signal (22).

14. The inductive proximity sensor in accordance with claim 1, further comprising a microprocessor (40), with said microprocessor being suitable to carry out a method of determining at least one of the presence of an electrically conductive object and the distance of an electrically conductive object (20) by means of an inductive proximity sensor (10), with the inductive proximity sensor being configured to evaluate an oscillation in the form of an analog signal (22) having an amplitude, and the amplitude depending on a member of the group consisting of the presence of an electrically conductive object, an absence of an electrically conductive object, and the distance of an electrically conductive object (20),
the method comprising the steps of:
converting the analog signal (22) into a digital input signal (26, 26'); and
converting the digital input signal (26, 26') into a digital output signal (34),
wherein the step of converting the digital input signal (26, 26') into a digital output signal (34) comprises the step of:

multiplying the digital input signal (26, 26') by a digital reference signal, wherein the digital reference signal is either identical to the digital input signal (26, 26') or only differs from the digital input signal (26, 26') by a constant factor to obtain a multiplied signal.

15. The inductive proximity sensor in accordance with claim 14, wherein the at least one A/D converter (24) of the inductive proximity sensor (10) is integrated in the microprocessor (40).

16. The inductive proximity sensor in accordance with claim 1, further comprising an application-specific integrated circuit (ASIC), with aid application-specific integrated circuit being suitable to carry out a method of determining at least one of the presence of an electrically conductive object and the distance of an electrically conductive object (20) by means of an inductive proximity sensor (10), with the inductive proximity sensor being configured to evaluate an oscillation in the form of an analog signal (22) having an amplitude, and the amplitude depending on a member of the group consisting of the presence of an electrically conductive object, an absence of an electrically conductive object, and the distance of an electrically conductive object (20), the method comprising the steps of:
converting the analog signal (22) into a digital input signal (26, 26'); and
converting the digital input signal (26, 26') into a digital output signal (34),
wherein the step of converting the digital input signal (26, 26') into a digital output signal (34) comprises the step of:
multiplying the digital input signal (26, 26') by a digital reference signal, wherein the digital reference signal is either identical to the digital input signal (26, 26') or only differs from the digital input signal (26, 26') by a constant factor to obtain a multiplied signal.

17. A method of determining at least one of the presence of an electrically conductive object and the distance of an electrically conductive object (20) by means of an inductive proximity sensor (10), with the inductive proximity sensor being configured to evaluate an oscillation in the form of an analog signal (22) having an amplitude, and the amplitude depending on a member of the group consisting of the presence of an electrically conductive object, an absence of an electrically conductive object, and the distance of an electrically conductive object (20), the method comprising the steps of:
converting the analog signal (22) into a digital input signal (26, 26'); and
converting the digital input signal (26, 26') into a digital output signal (34),
wherein the step of converting the digital input signal (26, 26') into a digital output signal (34) comprises the step of:
multiplying the digital input signal (26, 26') by a digital reference signal, wherein the digital reference signal is either identical to the digital input signal (26, 26') or only differs from the digital input signal (26, 26') by a constant factor to obtain a multiplied signal.

18. The method in accordance with claim 17, wherein the step of converting the analog signal (22) into a digital input signal (26) further comprises the step of:
dynamically adapting the sampling frequency of an A/D converter (24) which is used for converting the analog signal (22) into a digital input signal (26, 26') to at least one of a change in the frequency of the oscillation and a change in a bandwidth of the analog signal (22).

19. The method in accordance with claim 14, further comprising the step of:
modifying at least one of the digital input signal (26, 26') and the digital output signal (34) for compensating a temperature influence on the analog signal (22).

20. The method in accordance with claim 17, wherein the step of converting the digital signal (26, 26') into a digital output signal (34) further comprises the step of:
low pass filtering of the multiplied signal such that a constant component of the multiplied signal is maintained.

21. The method in accordance with claim 17, wherein the step of converting the digital signal (26, 26') into a digital output signal (34) further comprises the step of:
low pass filtering of the multiplied signal such that substantially only a constant component of the multiplied signal is maintained.

22. The method in accordance with claim 17, further comprising the step of:
separating a constant component of the digital input signal (26) from the digital input signal (26).

* * * * *